United States Patent
Cai et al.

(10) Patent No.: US 9,455,330 B2
(45) Date of Patent: Sep. 27, 2016

(54) RECESSING RMG METAL GATE STACK FOR FORMING SELF-ALIGNED CONTACT

(71) Applicants: International Business Machines Corporation, Armonk, NY (US); GLOBALFOUNDRIES Inc., Grand Cayman (KY)

(72) Inventors: Xiuyu Cai, Niskayuna, NY (US); Kangguo Cheng, Schenectady, NY (US); Ali Khakifirooz, Los Altos, CA (US); Ruilong Xie, Schenectady, NY (US)

(73) Assignees: International Business Machines Corporation, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/550,019

(22) Filed: Nov. 21, 2014

(65) Prior Publication Data

US 2016/0149015 A1    May 26, 2016

(51) Int. Cl.
| | |
|---|---|
| H01L 21/44 | (2006.01) |
| H01L 29/66 | (2006.01) |
| H01L 21/283 | (2006.01) |
| H01L 21/308 | (2006.01) |
| H01L 29/06 | (2006.01) |
| H01L 29/78 | (2006.01) |

(52) U.S. Cl.
CPC ....... *H01L 29/66545* (2013.01); *H01L 21/283* (2013.01); *H01L 21/3083* (2013.01); *H01L 29/0649* (2013.01); *H01L 29/66553* (2013.01); *H01L 29/78* (2013.01)

(58) Field of Classification Search
CPC .................. H01L 21/28008; H01L 21/28079; H01L 21/02293
USPC .......................................................... 438/658
See application file for complete search history.

(56) References Cited

U.S. PATENT DOCUMENTS

| | | | |
|---|---|---|---|
| 6,444,513 B1 * | 9/2002 | Besser .............. | H01L 21/28088 257/57 |
| 6,933,243 B2 | 8/2005 | Shen et al. | |
| 8,198,152 B2 | 6/2012 | Beyer et al. | |
| 8,338,306 B2 | 12/2012 | Heinrich et al. | |
| 8,367,504 B2 | 2/2013 | Heinrich et al. | |
| 2002/0072223 A1 * | 6/2002 | Gilbert .............. | H01L 21/32051 438/629 |
| 2009/0321843 A1 | 12/2009 | Waite et al. | |
| 2010/0044803 A1 * | 2/2010 | Chen ................. | H01L 21/28088 257/408 |
| 2010/0244141 A1 | 9/2010 | Beyer et al. | |
| 2011/0156154 A1 | 6/2011 | Hoentschel et al. | |
| 2012/0313178 A1 * | 12/2012 | Liao .................. | H01L 29/66545 257/368 |
| 2012/0329261 A1 * | 12/2012 | Wang .................... | H01L 21/265 438/589 |
| 2014/0154853 A1 * | 6/2014 | Xu ..................... | H01L 21/28088 438/290 |
| 2015/0061028 A1 * | 3/2015 | He ................... | H01L 21/823814 257/369 |

* cited by examiner

*Primary Examiner* — Caridad Everhart
(74) *Attorney, Agent, or Firm* — Scully, Scott, Murphy & Presser, P.C.; Steven J. Meyers (57) ABSTRACT

Embodiments of the present invention may include methods of incorporating an embedded etch barrier layer into the replacement metal gate layer of field effect transistors (FETs) having replacement metal gates, as well as the structure formed thereby. The embedded etch stop layer may be composed of embedded dopant atoms and may be formed using ion implantation. The embedded etch stop layer may make the removal of replacement metal gate layers easier and more controllable, providing horizontal surfaces and determined depths to serve as the base for gate cap formation. The gate cap may insulate the gate from adjacent self-aligned electrical contacts.

16 Claims, 7 Drawing Sheets

RECESSING RMG METAL GATE STACK FOR FORMING SELF-ALIGNED CONTACT

BACKGROUND

The present invention relates to semiconductor devices, and particularly to recessing the gate dielectric and work function metals of a replacement metal gate field effect transistor (FET).

FETs are commonly employed in electronic circuit applications. FETs may include a source region and a drain region spaced apart by a semiconductor channel region. In planar FETs, the semiconductor channel region may be a semiconductor substrate. In finFETs, the semiconductor channel region may be a semiconductor fin. A gate, potentially including a gate dielectric layer, a work function metal layer, and a metal electrode, may be formed next to the channel region. By applying voltage to the gate, the conductivity of the channel region may increase and allow current to flow from the source region to the drain region.

Due in part to the relative instability of the dielectric layer and work function metal layer of the gate, a gate-last process, or replacement metal gate process, may be used where a sacrificial gate is formed prior to forming other components of the FET. The sacrificial gate may then be removed to form a recessed region that may then be filled with a replacement metal gate potentially including a gate dielectric layer, a work function metal layer, and a metal electrode. Because the replacement metal gate is formed after the other components of the FET, it is not subjected to various potentially damaging processing steps, for example high-temperature anneals. Prior to forming the metal electrode, the gate dielectric layer and the work function metal layer may be recessed to a height less than the height of the recessed region to reduce the gate resistance.

SUMMARY

According to an embodiment, a method is disclosed. The method may include: forming a first embedded etch stop layer in a gate dielectric layer and a work-function metal layer of a replacement metal gate (RMG) using ion implantation. The first embedded etch stop layer may be composed of a layer of dopant atoms embedded at a depth below an upper portion of the gate dielectric layer and an upper portion of the work-function metal layer.

According to another embodiment, a method is disclosed. The method may include: removing a dummy gate from a field effect transistor (FET) structure to form a gate recess region, the FET structure comprising the dummy gate formed on a substrate, a spacer adjacent to the dummy gate, and a source-drain region adjacent to the spacer; forming a gate dielectric layer in the gate recess region, the gate dielectric layer having an upper surface that is substantially flush with an upper surface of the spacer; forming a work-function metal layer on the gate dielectric layer, the work-function metal layer having an upper surface that is substantially flush with an upper surface of the spacer; forming a first embedded etch stop layer in the gate dielectric layer and the work-function metal layer using ion implantation, wherein the first embedded etch stop layer may be composed of a layer of dopant atoms embedded at a depth below an upper portion of the gate dielectric layer and an upper portion of the work-function metal layer; removing the upper portion of the gate dielectric layer; removing the upper portion of the work-function metal layer; removing the first embedded etch stop layer to expose a lower portion of the gate dielectric layer and a lower portion of the work-function metal layer; forming a gate electrode on the lower portion of the gate dielectric layer and the lower portion of the work-function metal layer; and forming a gate cap in the gate recess region, the gate cap having an upper surface that is substantially flush with an upper surface of the spacer and an upper surface of an interlevel dielectric (ILD) layer adjacent to the spacer.

According to another embodiment, a structure is disclosed. The structure may include: a gate dielectric layer on a substrate; a work-function metal layer on the gate dielectric layer, the work-function metal layer having an upper surface that is substantially flush with an upper surface of the gate dielectric layer; a gate electrode on the upper surface of the gate dielectric layer and the upper surface of the work-function metal layer; a gate cap above the gate electrode, the gate cap having an upper surface that is substantially flush with an upper surface of a spacer that is adjacent to the gate cap, the gate electrode, and the gate dielectric layer; and a first embedded etch stop layer in the spacer, the first embedded etch stop layer adjacent to the gate dielectric and comprising dopant atoms. The structure may also include a second embedded etch stop layer between the gate electrode and the gate cap, the second embedded etch stop layer extending laterally into the spacer and comprising dopant atoms.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention may include methods of incorporating an embedded etch barrier layer into the replacement metal gate layer of field effect transistors (FETs) having replacement metal gates, as well as the structure formed thereby. Because the typical process of fabricating FETs having replacement metal gates involves multiple etching and planarizing steps, the gate height of FET may vary due to the cumulative variation of each etching and planarizing step, which may ultimately lead to reduced device performance, increased device variability, or inoperability. By incorporating an embedded etch barrier layer into the replacement metal gate layer, embodiments of the present invention may, among other potential benefits, reduce gate height variation by planarizing the replacement metal gates to a consistent level (i.e., the level of the embedded etch barrier).

Figure 1:
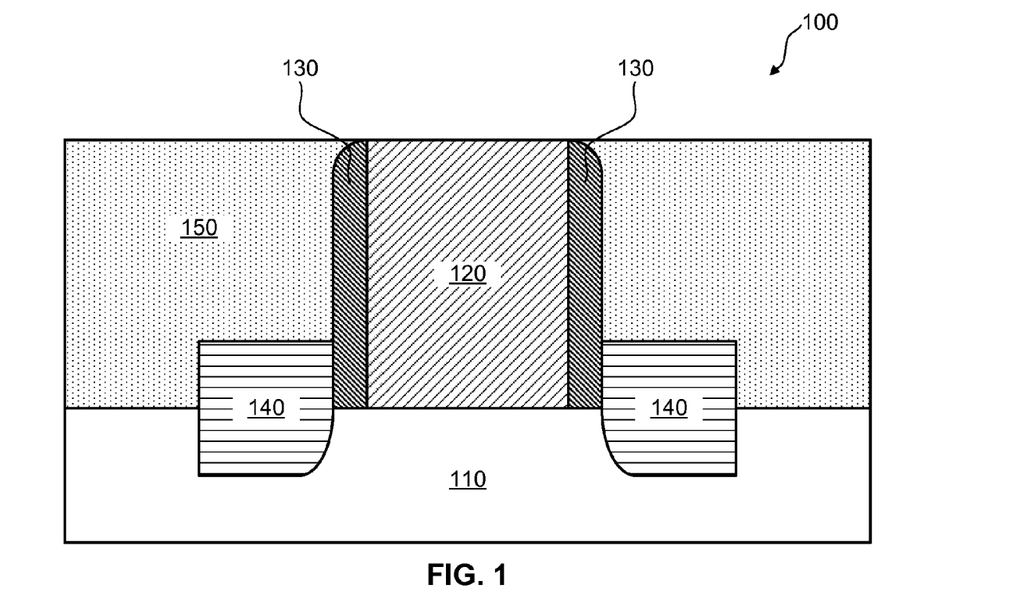
FIG. 1 is a cross section view depicting a field effect transistor (FET) structure having a dummy gate, according to an embodiment of the present invention.

Referring to FIG. 1 a field effect transistor (FET) structure 100 may be provided or fabricated. The FET structure 100 may include a sacrificial gate 120 above a substrate 110. A pair of source-drain regions 140 may be adjacent to substrate 110 on opposite sides of the sacrificial gate 120, separated from the sacrificial gate 120 by spacers 130. The substrate 110 may be covered by an interlevel dielectric (ILD) layer 150 having a top surface that is substantially flush with the top surface of the sacrificial gate 120.

In the depicted embodiment, FET structure 100 is a planar device so that the substrate 110 may be a bulk semiconductor substrate. In such embodiments, the substrate 110 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In an embodiment, the substrate 110 may be approximately, but is not limited to, several hundred microns thick. For example, the substrate 110 may have a thickness ranging from approximately 0.5 mm to approximately 1.5 mm. In other embodiments where the FET structure is a planar device, the substrate 110 may be a semiconductor-on-insulator (SOI) substrate, where a buried insulator layer separates a base substrate from a top semiconductor layer. The components of the FET structure 100 may then be formed in or adjacent to the top semiconductor layer.

In another embodiment, the FET structure 100 may be a fin field effect transistor ("finFET"), in which case the substrate 110 may be a semiconductor fin. While embodiments depicted in FIGS. 1-11 refer to a planar device, a person of ordinary skill in the art will understand that the method described will apply equally to finFET devices. In yet another embodiment, the FET structure 100 may be a nanowire field effect transistor, in which case the substrate 110 may be a semiconductor nanowire or a stack of nanowires. While embodiments depicted in FIGS. 1-11 refer to a planar device, a person of ordinary skill in the art will understand that the method described will apply equally to nanowire devices.

The sacrificial gate 120 may have a height ranging from approximately 30 nm to approximately 200 nm, preferably approximately 50 nm to approximately 100 nm. Because the replacement metal gate that will later replace the sacrificial gate 120 may be planarized to height less than its initial height (FIG. 11), the sacrificial gate 120 may have a height greater than the ultimately desired height of the replacement metal gate. The sacrificial gate 120 may include any of a sacrificial dielectric layer, a sacrificial gate electrode, and a hard mask layer above the sacrificial gate electrode (not shown). The sacrificial dielectric layer may be made of any known dielectric material such as silicon oxide or silicon nitride. The sacrificial gate electrode may be made of, for example, an amorphous or polycrystalline silicon material. Other suitable materials for the sacrificial dielectric layer and the sacrificial gate electrode known in the art may also be used. The sacrificial dielectric layer and the sacrificial gate electrode may be formed by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

The hard mask may be formed above the sacrificial gate electrode to protect the sacrificial gate electrode during subsequent fabrication processes. The hard mask may be made of an insulating material, such as, for example, silicon nitride, silicon oxide, silicon oxynitrides, or a combination thereof, may have a thickness ranging from approximately 20 nm to approximately 50 nm, and may be formed by any suitable deposition technique known in the art, including ALD, CVD, PVD, MBD, PLD, or LSMCD.

The spacers 130 may be formed on the sidewalls of the sacrificial gate 120. The spacers 130 may be made of any insulating material, such as silicon nitride, silicon oxide, silicon oxynitrides, or a combination thereof. In some embodiment, the spacers 130 may be made of so-called "low-k" dielectric material with a relative dielectric constant less than 7. Exemplary low-k materials are SiBCN and SiOCN. The spacers 130 may have a thickness ranging from 2 nm to approximately 100 nm, preferably approximately 2 nm to approximately 25 nm. In some embodiments, the spacers 130 may be made of the same material as the hard mask described above. In some embodiments, the spacers 130 may be made of a material different from the hard mask. In a preferred embodiment, the hard mask and the spacers 130 may be made of silicon nitride. The spacers 130 may be formed by any method known in the art, including depositing a conformal silicon nitride layer over the sacrificial gate 120 and removing unwanted material from the conformal silicon nitride layer using a anisotropic etching process such as, for example, reactive ion etching (RIE) or plasma etching (not shown). Methods of forming spacers are well-known in the art and other methods are explicitly contemplated. Further, in various embodiments, the spacers 130 may include one or more layers. While the spacers 130 are herein described in the plural, the spacers 130 may consist of a single spacer surrounding the sacrificial gate 120.

The source-drain regions 140 may be formed on the substrate 110 adjacent to the spacers 130. Numerous methods of forming source-drain regions are known in the art, any of which may be used to form the source-drain regions 140. In some embodiments, the source-drain regions 140 may be formed by doping portions of the substrate 110 (not shown). In other embodiments, including the embodiment depicted in FIG. 1, the source-drain regions 140 may be formed by growing epitaxial semiconductor regions adjacent to the substrate 110. The epitaxial semiconductor regions may extend above and/or below the top surface of the substrate 110 as shown.

The ILD layer 150 may deposited on the substrate 110, the source-drain regions 140, the spacers 130, and the sacrificial gate 120. The ILD layer 150 may be composed of any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. In some embodiments, various barriers or liners (not shown) may be formed below the ILD layer 150. After depositing the ILD layer 150, the ILD layer 150 may be planarized, using for example chemical-mechanical planarization (CMP), so that the sacrificial gate 120 is exposed and a top surface of the ILD layer 150 is substantially flush with the top surface of the sacrificial gate 120.

Figure 2:
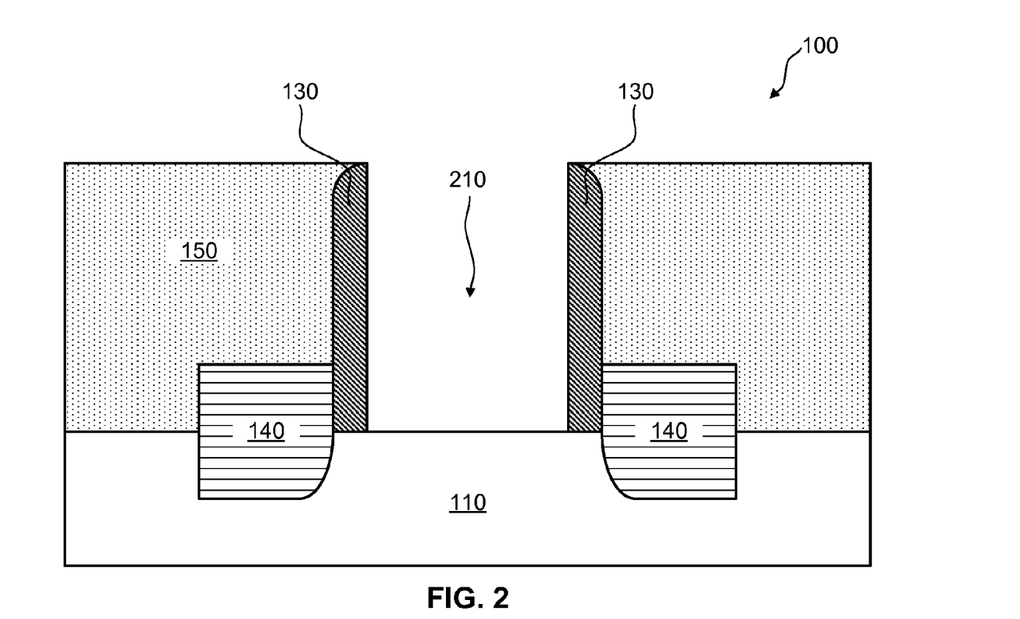
FIG. 2 is a cross section view depicting removing the dummy gate of the FET to form a gate recess region, according to an embodiment of the present invention.

Referring to FIG. 2, the sacrificial gate 120 may be removed to form a gate recess region 210 above the substrate 110 and between the spacers 130. The sacrificial gate 120 may be removed by any suitable etching process known in the art capable of selectively removing the sacrificial gate 120 without substantially removing material of the substrate 110, the spacers 130, or the ILD layer 150. In an exemplary embodiment, the sacrificial gate 120 may be removed, for example, by a reactive ion etching (RIE) or plasma etching process, in conjunction with wet etching processing.

Figure 3:
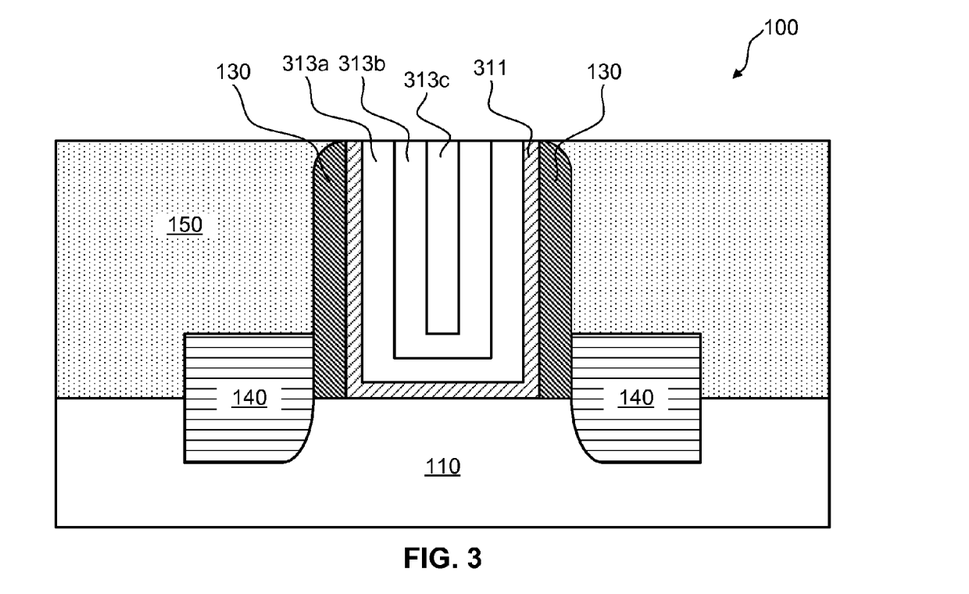
FIG. 3 is a cross section view depicting depositing a gate dielectric layer and work function metals in the gate recess region, according to an embodiment of the present invention.

Referring to FIG. 3, a gate dielectric layer 311 and one or more work function metals, including for example, work-function metals 313a-313c may deposited in the gate recess region 210. While the embodiment depicted in FIG. 3 includes 3 work function metal layers, other embodiments may include more or less layers. In some embodiments, the gate dielectric layer 311 and the work-function metals 313a-313c may fill the gate recess region 210.

The gate dielectric layer 311 may be made of, for example, silicon oxide, hafnium oxide, zirconium oxide, aluminum oxide, titanium oxide, lanthanum oxide, strontium titanate, lanthanum aluminum oxide, or mixtures thereof. Other suitable gate dielectric materials may be known in the art. The physical thickness of the gate dielectric layer 311 may vary, but typically may have a thickness ranging from approximately 0.5 nm to approximately 10 nm.

The work-function metals 313a-313c may be made of, for example, aluminum, lanthanum oxide, magnesium oxide, strontium titanate, tantalum carbide, titanium nitride, and strontium oxide. In an exemplary embodiment, work function metals 313a and 313c may be made of the same material, for example, titanium nitride, while the work function metal 313b sandwiched between them may be made of a different material, for example tantalum carbide. The work-function metals 313a-313c may thickness ranging from approximately 0.5 nm to approximately 5 nm, though greater and lesser thickness are explicitly contemplated. The thickness of the topmost work function metal 313c may have a thickness sufficient to fill the gate recess region 210.

The gate dielectric layer 311 and the work-function metals 313a-313c may be formed by any suitable deposition technique, such as, but not limited to, atomic layer deposition (ALD), chemical vapor deposition (CVD), physical vapor deposition (PVD), molecular beam deposition (MBD), pulsed laser deposition (PLD), or liquid source misted chemical deposition (LSMCD), sputtering, or plating. In some embodiments, a planarization process, such as CMP, may be performed after the deposition of the gate dielectric layer 311 and the work-function metals 313a-313c to remove so that an upper surface of the gate dielectric layer 311 and an upper surface of the work-function metals 313a-313c may be substantially flush with the upper surface of the ILD layer 150.

Figure 4:
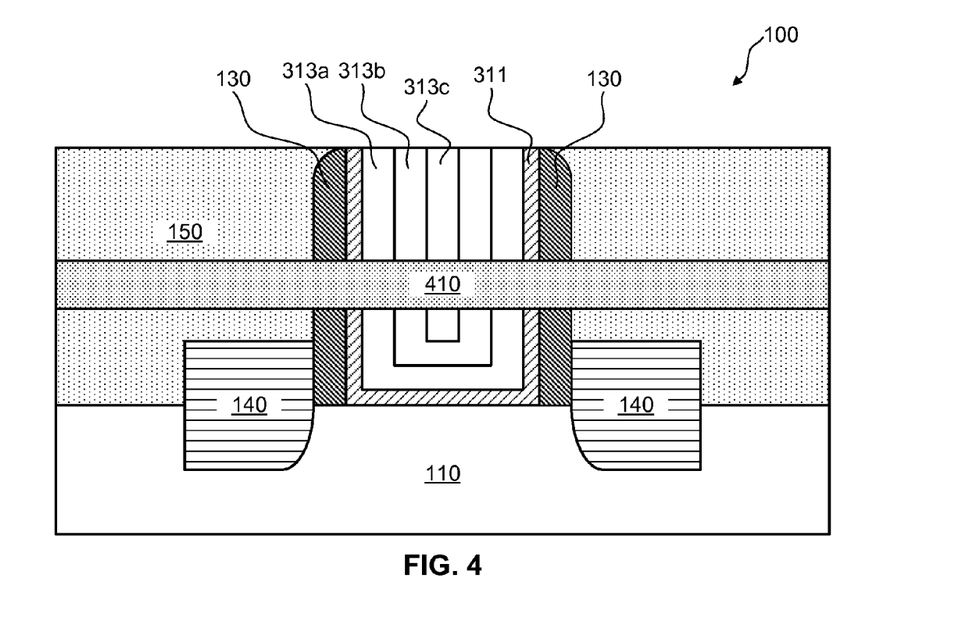
FIG. 4 is a cross section view depicting forming a first embedded etch stop layer in the gate dielectric and work function metals, according to an embodiment of the present invention.

Referring to FIG. 4, a first embedded etch stop layer 410 may be formed in the work function metals 313a-313c. The first embedded etch stop layer 410 may be formed by implanting barrier dopants into the work function metals 313a-313c. In some embodiments, including the embodiment depicted in FIG. 4, the first embedded etch stop layer 410 may also be formed in the gate dielectric layer 311, the spacers 130, and the ILD layer 150 as well during the implantation process.

Suitable barrier dopants for use in the first embedded etch stop layer 410 may include, for example, any atom or ion capable of being controllably implanted into the work function metals 313a-313c and the gate dielectric layer 311 at a desired depth, and subsequently remain unaffected by etching of the work function metals 313a-313c and gate dielectric layer 311 above the first embedded etch stop layer 410. Exemplary barrier dopants may include silicon, carbon, and nitrogen implanted by ion implantation. In one embodiment, the barrier dopants may include nitrogen implanted with an energy ranging from 5 KeV to 100 KeV and a dose ranging from $10^{15}$ atoms×cm$^{-2}$ to $10^{16}$ atoms×cm$^{-2}$. The first embedded etch stop layer 410 may have a thickness ranging from approximately 3 nm to approximately 10 nm and may be formed at a depth of approximately 10 nm to approximately 40 nm, measured from the upper surface of the work function metals 313a-313c. While the first embedded etch stop layer 410 is depicted in FIG. 4 as a uniform layer, the first embedded etch stop layer 410 may include any number of different regions, with each region made of a combination of the barrier dopant and a material of one of the work function metals 313a-313c, the gate dielectric layer 311, the spacers 130, and the ILD layer 150.

Figure 5:
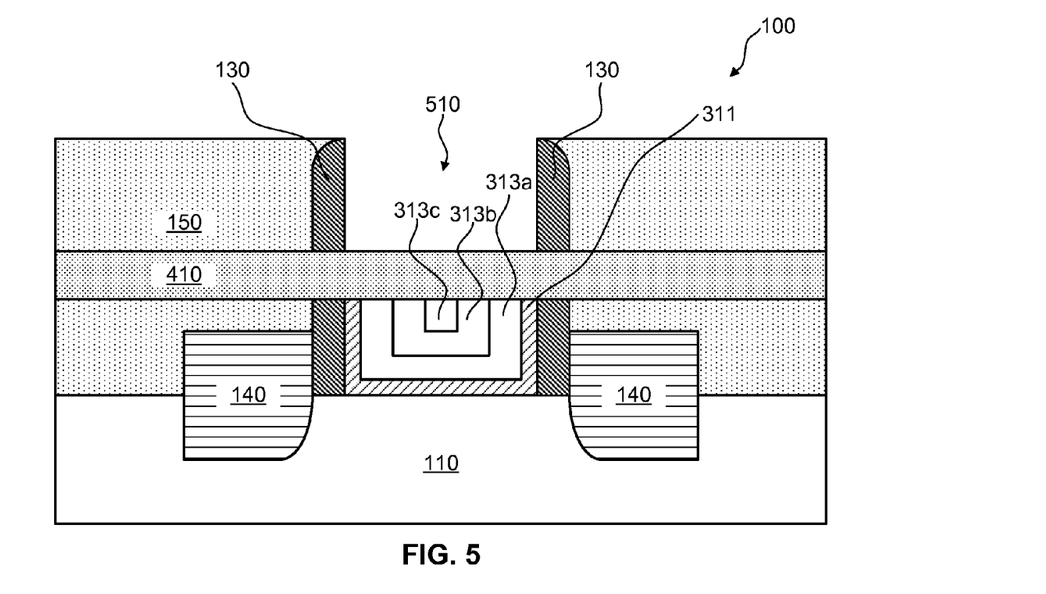
FIG. 5 is a cross section view depicting removing portions of the gate dielectric layer and work function metals above the first embedded etch stop layer, according to an embodiment of the present invention.

Referring to FIG. 5, portions of the work function metals 313a-313c and the gate dielectric layer 311 above the first embedded etch stop layer 410 may be removed to form a first gate recess 510. The first gate recess 510 may have a bottom that is defined by an upper surface of the first embedded etch stop layer 410. The portions of the work function metals 313a-313c and the gate dielectric layer 311 above the first embedded etch stop layer 410 may be removed using any suitable etching process capable of selectively removing the material of the work function metals 313a-313c and the gate dielectric layer 311 without substantially removing the material of the first embedded etch stop layer 410. In an exemplary embodiment, the portions of the work function metals 313a-313c above the first embedded etch stop layer 410 may be removed by an aqueous etchant containing ammonium hydroxide and hydrogen peroxide. Optionally, the gate dielectric layer 311 above the first embedded etch stop layer 410 may be removed by an aqueous etchant containing hydrofluoric acid.

Figure 6:
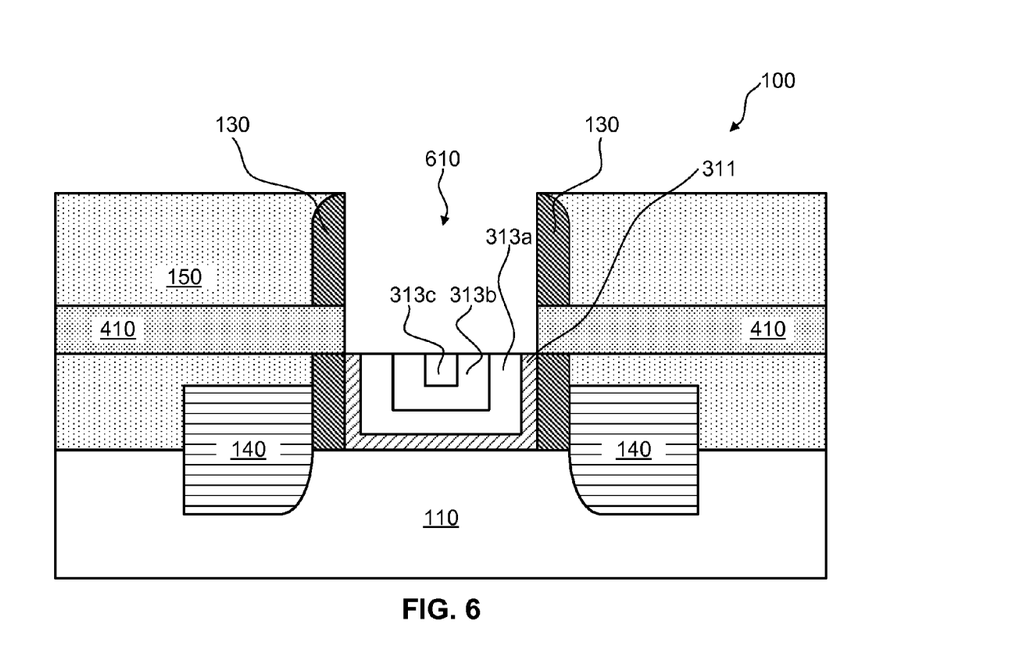
FIG. 6 is a cross section view depicting removing the first embedded etch stop layer, according to an embodiment of the present invention.

Referring to FIG. 6, the first embedded etch stop layer 410 (FIG. 5) may be removed to expose the remaining portions of the work function metals 313a-313c and the gate dielectric layer 311, and form a deep gate recess 610. The deep gate recess 610 may have a bottom that is defined by an upper surface of the remaining portions of the work function metals 313a-313c and the gate dielectric layer 311. The first embedded etch stop layer 410 may be removed using any suitable etching process capable of selectively removing the material of the first embedded etch stop layer 410 without substantially removing the material of the work function metals 313a-313c, the gate dielectric layer 311, the spacers 130, and the ILD layer 150. In an exemplary embodiment, the first embedded etch stop layer 410 may be removed by a dry etch process such as reactive ion etch (RIE).

Figure 7:
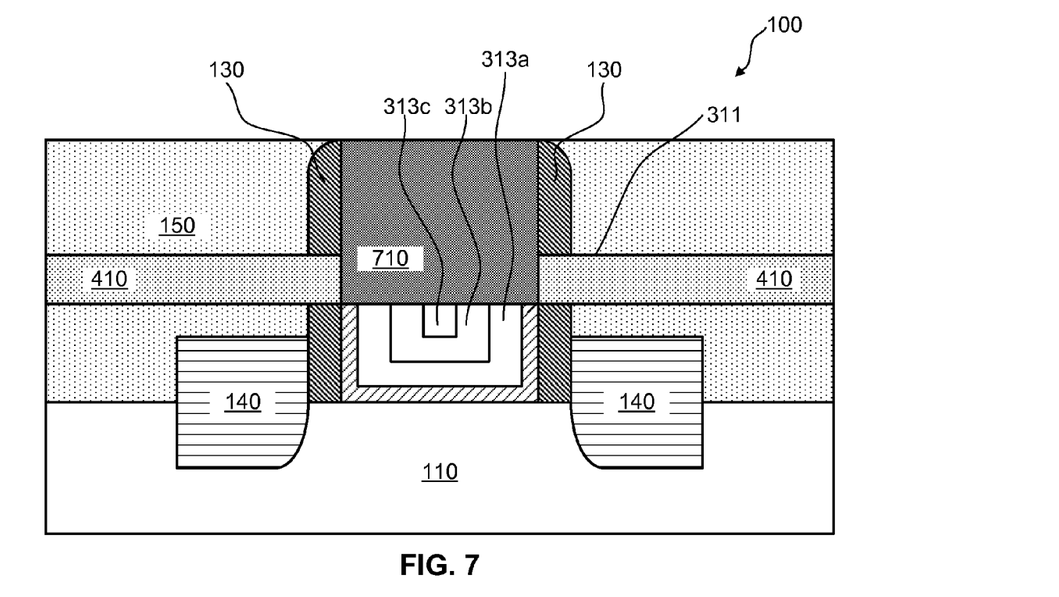
FIG. 7 is a cross section view depicting forming a gate electrode above the remaining portions of the gate dielectric layer and the work function metals, according to an embodiment of the present invention.

Referring to FIG. 7, a gate electrode 710 may be formed in the deep gate recess 610 (FIG. 6). The gate electrode may be made of any suitable gate conductor material such as, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode 710 may be formed by any suitable deposition process, such as, but not limited to, ALD, CVD, PVD, MBD, PLD, LSMCD, sputtering, or plating. If after deposition the gate electrode 710 overfills the first gate recess 510, the gate electrode 710 may be planarized, for example by chemical-mechanical planarization (CMP), so that an upper surface of the gate electrode 710 is substantially flush with the upper surface of the ILD layer 150.

Figure 8:
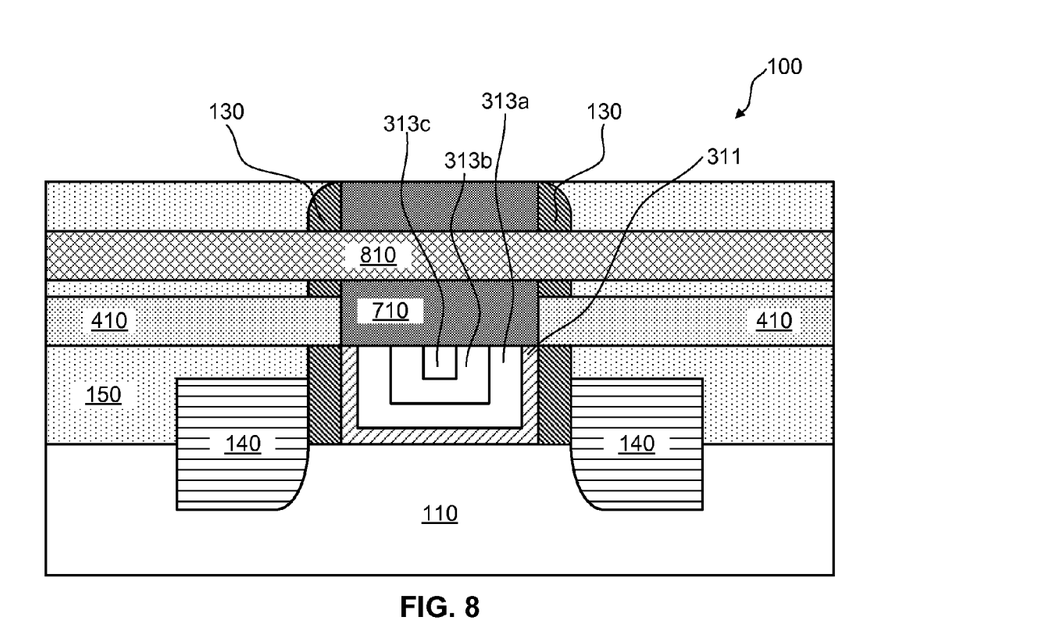
FIG. 8 is a cross section view depicting forming a second embedded etch stop layer in the gate electrode, according to an embodiment of the present invention.

Referring to FIG. 8, a second embedded etch stop layer 810 may be formed in the gate electrode 710. The second embedded etch stop layer 810 may be formed by implanting barrier dopants into the gate electrode 710. In some embodiments, including the embodiment depicted in FIG. 4, the first embedded etch stop layer 410 may also be formed in the gate dielectric layer 311, the spacers 130, and the ILD layer 150 as well during the implantation process.

Suitable barrier dopants may include, for example, any atom or ion capable of being controllably implanted into the gate electrode 710 at a desired depth, and subsequently remain unaffected by etching of the gate electrode 710 above the second embedded etch stop layer 810. Exemplary barrier dopants may include silicon, carbon, and nitrogen implanted by ion implantation. In one embodiment, the barrier dopants may include nitrogen implanted with an energy ranging from 5 KeV to 60 KeV and a dose ranging from $10^{15}$ atoms×cm$^{-2}$ to $10^{16}$ atoms×cm$^{-2}$. The second embedded etch stop layer 810 may have a thickness ranging from approximately 3 nm to approximately 8 nm and may be formed at a depth of approximately 10 nm to approximately 50 nm, measured from the upper surface of the gate electrode 710. While the second embedded etch stop layer 810 is depicted in FIG. 8 as a uniform layer, the second embedded etch stop layer 810 may include any number of different regions, with each region made of a combination of the barrier dopant and a material of one of the gate electrode 710, the spacers 130, and the ILD layer 150.

Figure 9:
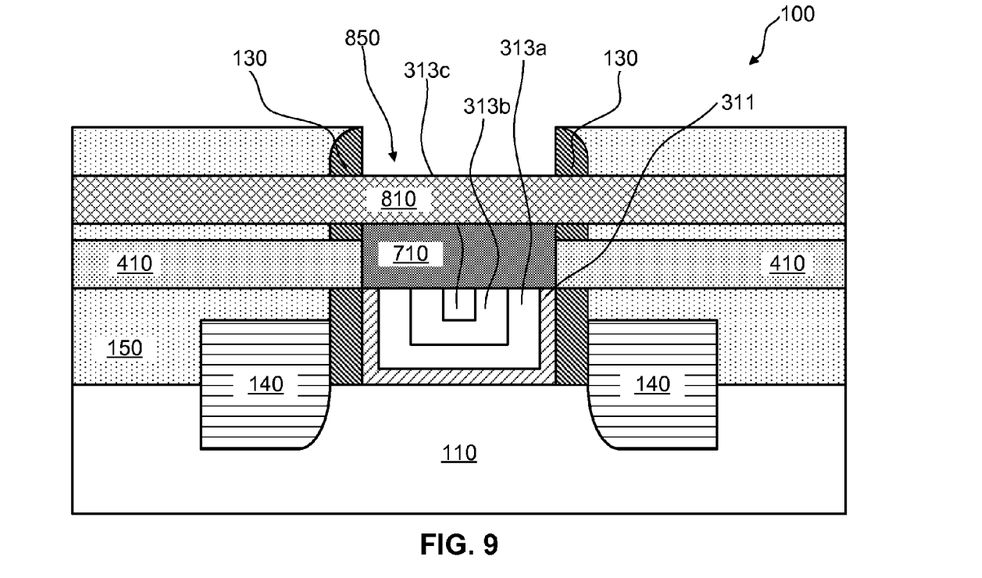
FIG. 9 is a cross section view depicting removing the portion of the gate electrode above the second embedded etch stop layer, according to an embodiment of the present invention.

Referring to FIG. 9, a portion of the gate electrode 710 above the second embedded etch stop layer 810 may be removed to form a second gate recess 850. The second gate recess 850 may have a bottom that is defined by an upper surface of the second embedded etch stop layer 810. The portion of the gate electrode 710 above the second embedded etch stop layer 810 may be removed using any suitable etching process capable of selectively removing the material of the gate electrode 710 without substantially removing the material of the second embedded etch stop layer 810. In an exemplary embodiment, the portion of the gate electrode 710 above the second embedded etch stop layer 810 may be removed by an aqueous etchant containing hydrogen peroxide.

Figure 10:
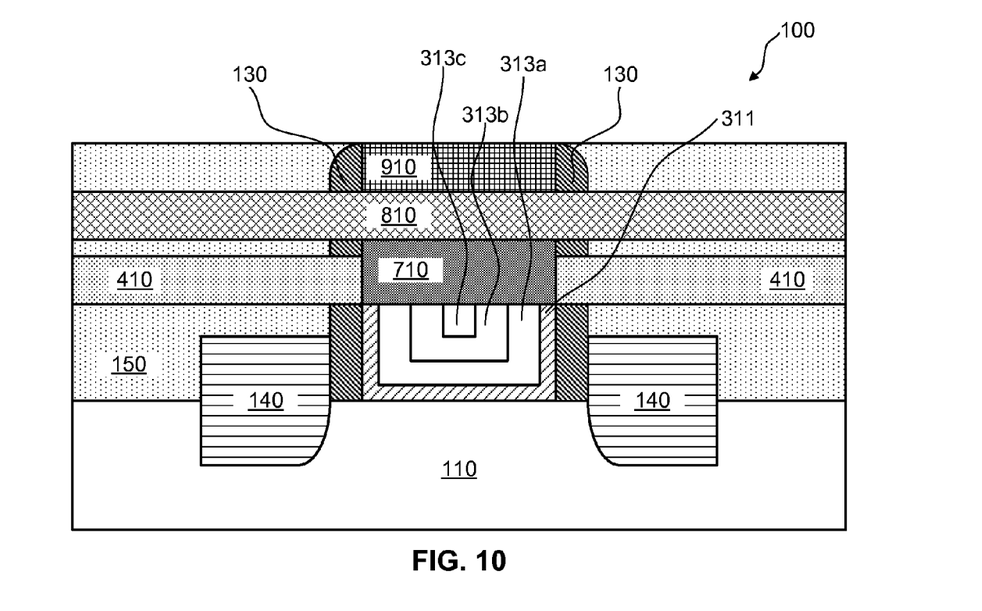
FIG. 10 is a cross section view depicting forming a gate cap above the second embedded etch stop layer, according to an embodiment of the present invention.

Referring to FIG. 10, a gate cap 910 may be formed in the second gate recess 850. The gate cap 910 may be composed of insulating material, such as a nitride, an oxide, or an oxynitride. In an embodiment, the gate cap 910 and the second embedded etch stop layer 810 may serve as a bi-layer gate cap. The gate cap 910 may be formed by any suitable deposition process, such as, but not limited to, ALD, CVD, PVD, MBD, PLD, LSMCD, sputtering, or plating. If after deposition the gate cap 910 overfills the second gate recess 850, the gate cap 910 may be planarized, for example by chemical-mechanical planarization (CMP), so that an upper surface of the gate cap 910 is substantially flush with the upper surface of the ILD layer 150.

Figure 11:
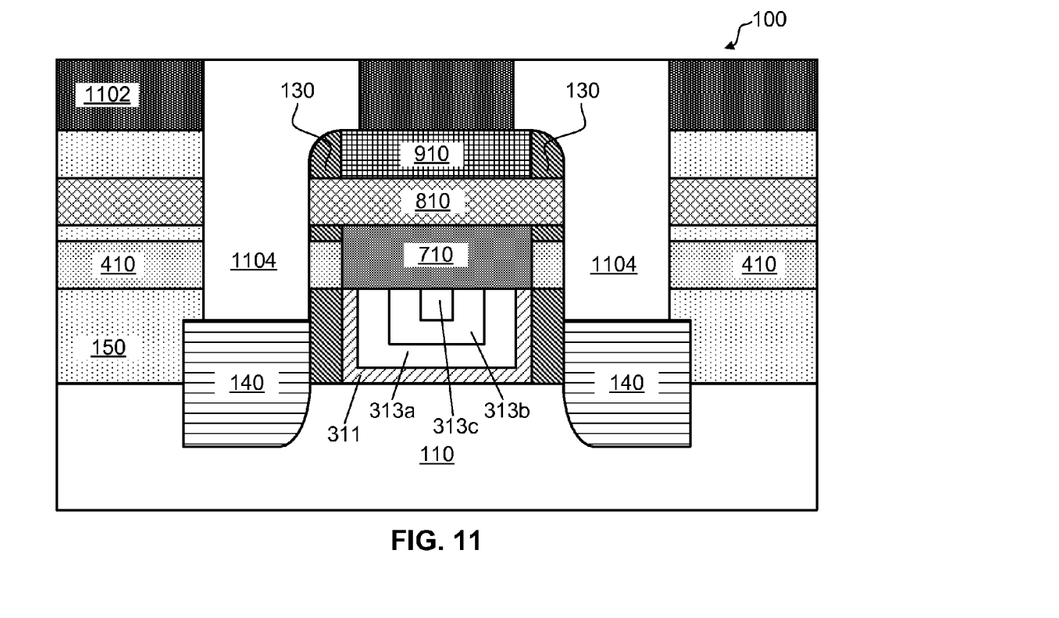
FIG. 11 is a cross section view depicting forming self-aligned contacts, according to an embodiment of the present invention.

Referring to FIG. 11, an upper dielectric layer 1102 and contacts 1104 may be formed on the structure 100. The upper dielectric layer 1102 may be formed on the upper surface of the ILD layer 150, the spacers 130, and the gate cap 910. The upper dielectric layer 1102 may be substantially similar to the ILD layer 150 and may formed using substantially similar techniques as those describe above with reference to FIG. 1.

The contacts 1104 may be formed removing portions of the upper dielectric layer 1102, the ILD layer 150, and portions of the second embedded etch stop layer 810 and the first embedded etch stop layer 410 that are composed of the barrier dopants and the ILD layer 150 selective to the gate cap 910, the spacers 130, and the source-drain regions 140 to form contact openings (not shown). The contact openings may expose an upper surface of the source drain regions 140. In an embodiment, the contact openings may be formed using a conventional etching process, such as, for example, RIE. The contact openings may then be filled with a conductive material to form the contacts 1104. In an embodiment, the conductive material may be a metal or metal alloy composed of, for example, Cu or Al. A bottom surface of the contacts 1104 may be in contact with the upper surface of the source-drain regions 140. Because of the selective nature of the etching process used to form the contact openings, the contacts 1104 may be referred to as self-aligned contacts. As shown in FIG. 11, the gate cap 910 and the second embedded etch stop layer 810 may insulate the gate electrode 710, the gate dielectric layer 311, and the work-function metals 313a-313c from the contacts 1102.

Another embodiment by which to recess the gate dielectric and work function metals of a replacement metal gate is described in detail below by referring to the accompanying drawings FIGS. 12-14. In the present embodiment, the second embedded etch stop layer 810 may be removed after the second gate recess 850 is formed as described above with reference to FIG. 9. Accordingly, FIG. 12 can be considered a continuation of the process after FIG. 9.

Figure 12:
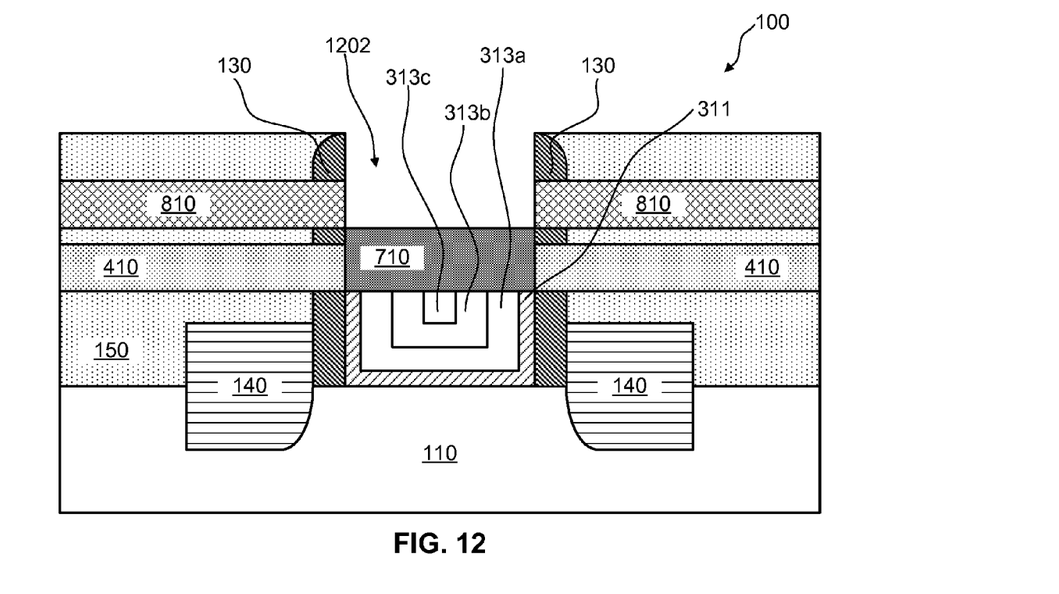
FIG. 12 is a cross section view depicting removing a portion of the second embedded etch stop layer, according to an embodiment of the present invention.

Referring to FIG. 12, the second embedded etch stop layer 810 may be removed after the second gate recess 850 is formed (FIG. 9) to form a deep gate cap recess 1202. The second embedded etch stop layer 810 may be removed using any suitable etching process capable of selectively removing the material of the second embedded etch stop layer 810 without substantially removing the material of the gate electrode 710, the spacers 130, and the ILD layer 150. In an exemplary embodiment, the first embedded etch stop layer 410 may be removed by a dry etching process such as RIE. In such an embodiment, the gate cap 910 may be formed directly on the gate electrode 710.

Figure 13:
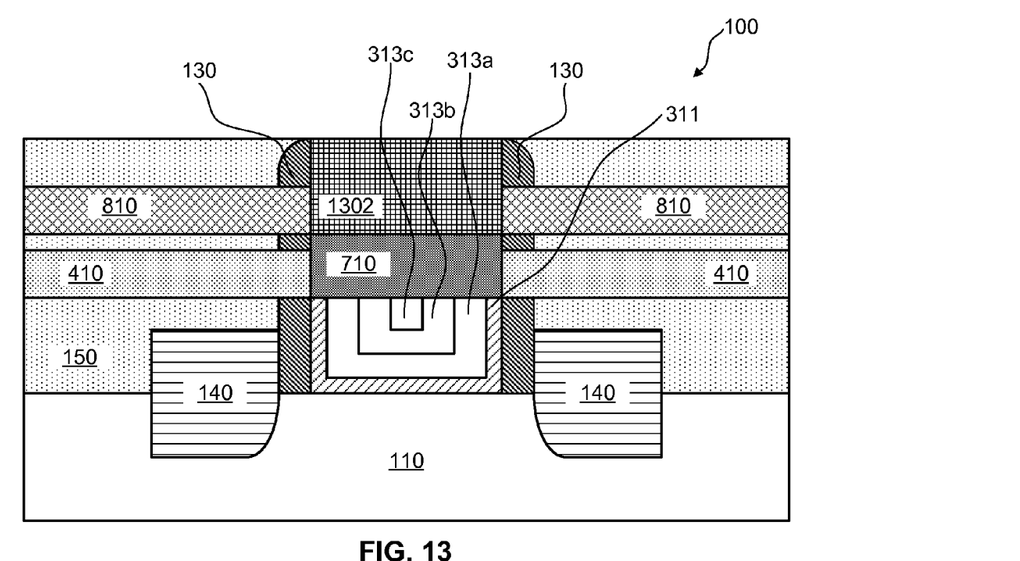
FIG. 13 is a cross section view depicting forming a gate cap on the gate electrode, according to an embodiment of the present invention.

Referring to FIG. 13, a gate cap 1302 may be formed in the deep gate cap recess 1202 (FIG. 12). The gate cap 1302 may be composed of insulating material, such as a nitride, an oxide, or an oxynitride. The gate cap 1302 may be formed by any suitable deposition process, such as, but not limited to, ALD, CVD, PVD, MBD, PLD, LSMCD, sputtering, or plating. If after deposition the gate cap 1302 overfills the deep gate gap recess 1202, the gate cap 1302 may be planarized, for example by chemical-mechanical planarization (CMP), so that an upper surface of the gate cap 1302 is substantially flush with the upper surface of the ILD layer 150.

Figure 14:
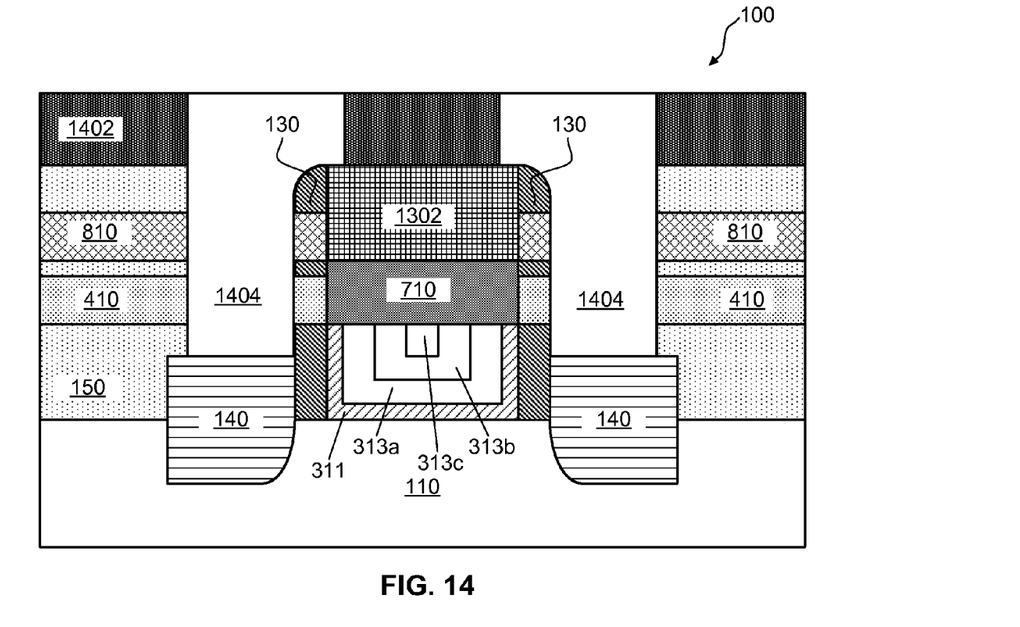
FIG. 14 is a cross section view depicting forming self-aligned contacts, according to an embodiment of the present invention.

Referring to FIG. 14, an upper dielectric layer 1402 and contacts 1404 may be formed on the structure 100. The upper dielectric layer 1402 may be formed on the upper surface of the ILD layer 150, the spacers 130, and the gate cap 910. The upper dielectric layer 1402 may be substantially similar to the ILD layer 150 and may formed using substantially similar techniques as those describe above with reference to FIG. 1.

The contacts 1404 may be formed removing portions of the upper dielectric layer 1402, the ILD layer 150, and portions of the second embedded etch stop layer 810 and the first embedded etch stop layer 410 that are composed of the barrier dopants and the ILD layer 150 selective to the gate cap 1302, the spacers 130, and the source-drain regions 140 to form contact openings (not shown). The contact openings may expose an upper surface of the source drain regions 140. In an embodiment, the contact openings may be formed using a conventional etching process, such as, for example, RIE. The contact openings may then be filled with a conductive material to form the contacts 1404. In an embodiment, the conductive material may be a metal or metal alloy composed of, for example, Cu or Al. A bottom surface of the contacts 1404 may be in contact with the upper surface of the source-drain regions 140. Because of the selective nature of the etching process used to form the contact openings, the contacts 1404 may be referred to as self-aligned contacts. As shown in FIG. 14, the gate cap 1302 may insulate the gate electrode 710, the gate dielectric layer 311, and the work-function metals 313a-313c from the contacts 1402.

Embodiments of the present invention may provide a new approach for precisely controlling the metal gate recess depth during reverse metal gate (RMG) fabrication by forming an embedded etch layer in the metal gate stack and then etching the top portion of the metal gate stack selectively to the embedded etch stop layer. This technique may improve the removal of workfunction metals in gates, typically composed of different metals sandwiched together, because the embedded etch stop layer may provide a flat and uniform surface for etching the different metals. This may aide in the formation of a gate recess, at a controllable depth, in which a dielectric capping layer may be formed to isolate the gate from a subsequent source-drain contact.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:
1. A method comprising:
   forming a first embedded etch stop layer in a gate dielectric layer and a work-function metal layer of a replacement metal gate (RMG) using ion implantation, wherein the first embedded etch stop layer comprises a layer of dopant atoms embedded at a depth below an upper portion of the gate dielectric layer and an upper portion of the work-function metal layer;
   removing the upper portion of the gate dielectric layer and the upper portion of the work-function metal layer;
   removing the first embedded etch stop layer to expose a lower portion of the gate dielectric layer and a lower portion of the work-function metal layer;
   forming a gate electrode on the lower portion of the gate dielectric layer and the lower portion of the work-function metal layer; and forming a gate cap on the gate electrode, the gate cap having an upper surface that is substantially flush with an upper surface of a spacer adjacent to the RMG and an upper surface of an interlevel dielectric (ILD) layer adjacent to the spacer.

2. The method of claim 1, wherein the dopant atoms comprise silicon, carbon, or nitrogen.

3. The method of claim 1, wherein the first embedded etch stop layer extends laterally through the spacer and the ILD layer.

4. The method of claim 1, further comprising:
forming an upper dielectric layer on the gate cap, the spacer, and the ILD layer;
removing a portion of the upper dielectric layer and the ILD layer, selective to the gate cap and the spacer, to form a contact opening, the contact opening exposing an upper surface of a source-drain region; and
forming an electrical contact in the contact opening.

5. The method of claim 1, wherein the work-function metal layer comprises one or more layers of metals having compositions of aluminum, lanthanum oxide, magnesium oxide, strontium titanate, tantalum carbide, titanium nitride, or strontium oxide.

6. A method comprising:
forming a first embedded etch stop layer in a gate dielectric layer and a work-function metal layer of a replacement metal gate (RMG) using ion implantation, wherein the first embedded etch stop layer comprises a layer of dopant atoms embedded at a depth below an upper portion of the gate dielectric layer and an upper portion of the work-function metal layer;
removing the upper portion of the gate dielectric layer and the upper portion of the work-function metal layer;
removing the first embedded etch stop layer to expose a lower portion of the gate dielectric layer and a lower portion of the work-function metal layer;
forming a gate electrode on the lower portion of the gate dielectric layer and the lower portion of the work-function metal layer;
forming a second embedded etch stop layer in the gate electrode, wherein the second embedded etch stop layer comprises a layer of dopant atoms embedded at a depth below an upper portion of the gate electrode;
removing the upper portion of the gate electrode; and
forming a gate cap on the second embedded etch stop layer, the gate cap having an upper surface that is substantially flush with an upper surface of a spacer adjacent to the RMG and an upper surface of an ILD layer adjacent to the spacer.

7. The method of claim 6, further comprising:
forming an upper dielectric layer on the gate cap, the spacer, and the ILD layer;
removing a portion of the upper dielectric layer and the ILD layer, selective to the gate cap and the spacer, to form a contact opening, the contact opening exposing an upper surface of a source-drain region; and
forming an electrical contact in the contact opening.

8. The method of claim 6, wherein the dopant atoms comprise silicon, carbon, or nitrogen.

9. The method of claim 6, wherein the first embedded etch stop layer and the second embedded etch stop layer extend laterally through the spacer and the ILD layer.

10. A method comprising:
removing a dummy gate from a field effect transistor (FET) structure to form a gate recess region, the FET structure comprising the dummy gate formed on a substrate, a spacer adjacent to the dummy gate, and a source-drain region adjacent to the spacer;
forming a gate dielectric layer in the gate recess region, the gate dielectric layer having an upper surface that is substantially flush with an upper surface of the spacer;
forming a work-function metal layer on the gate dielectric layer, the work-function metal layer having an upper surface that is substantially flush with an upper surface of the spacer;
forming a first embedded etch stop layer in the gate dielectric layer and the work-function metal layer using ion implantation, wherein the first embedded etch stop layer comprises a layer of dopant atoms embedded at a depth below an upper portion of the gate dielectric layer and an upper portion of the work-function metal layer;
removing the upper portion of the gate dielectric layer;
removing the upper portion of the work-function metal layer;
removing the first embedded etch stop layer to expose a lower portion of the gate dielectric layer and a lower portion of the work-function metal layer;
forming a gate electrode on the lower portion of the gate dielectric layer and the lower portion of the work-function metal layer; and
forming a gate cap in the gate recess region, the gate cap having an upper surface that is substantially flush with an upper surface of the spacer and an upper surface of an interlevel dielectric (ILD) layer adjacent to the spacer.

11. The method of claim 10, wherein the dopant atoms comprise silicon, carbon, or nitrogen.

12. The method of claim 10, further comprising:
forming an upper dielectric layer on the gate cap, the spacer, and the ILD layer;
removing a portion of the upper dielectric layer and the ILD layer, selective to the gate cap and the spacer, to form a contact opening, the contact opening exposing an upper surface of a source-drain region; and
forming an electrical contact in the contact opening.

13. The method of claim 10, wherein the first embedded etch stop layer extends laterally through the spacer and the ILD layer.

14. The method of claim 10, further comprising:
forming a second embedded etch stop layer in the gate electrode, wherein the second embedded etch stop layer comprises a layer of dopant atoms embedded at a depth below an upper portion of the gate electrode; and
removing the upper portion of the gate electrode.

15. The method of claim 14, wherein the dopant atoms comprise silicon, carbon, or nitrogen.

16. The method of claim 14, wherein the second embedded etch stop layer extends laterally through the spacer and the ILD layer.

* * * * *